(12) United States Patent
Gofman et al.

(10) Patent No.: US 6,348,784 B1
(45) Date of Patent: Feb. 19, 2002

(54) SWITCHING POWER SUPPLY

(75) Inventors: Igor Y. Gofman, Croton-on-Hudson, NY (US); Joseph G. Colombo, Lodi, NJ (US)

(73) Assignee: Coltene/Whaledent Inc., Manwah, NJ (US)

( * ) Notice: Subject to any disclaimer, the term of this patent is extended or adjusted under 35 U.S.C. 154(b) by 0 days.

(21) Appl. No.: 09/782,243

(22) Filed: Feb. 13, 2001

(51) Int. Cl.[7] .................................................. G05F 1/40
(52) U.S. Cl. ...................................................... 323/289
(58) Field of Search ................................ 323/289, 285, 323/284, 282

(56) References Cited

U.S. PATENT DOCUMENTS

| 4,870,553 A | 9/1989 | Brown |
| 4,937,470 A | 6/1990 | Zeiler |
| 5,740,097 A | 4/1998 | Satoh |
| 5,831,470 A | 11/1998 | Park et al. |
| 5,894,215 A | 4/1999 | Yazdy et al. |
| 5,959,442 A | 9/1999 | Hallberg et al. |
| 5,990,669 A | 11/1999 | Brown |
| 6,061,259 A | * 5/2000 | DeMichele ................. 363/125 |
| 6,087,817 A | 7/2000 | Varga |

* cited by examiner

Primary Examiner—Shawn Riley
(74) Attorney, Agent, or Firm—Rosenman & Colin, LLP

(57) ABSTRACT

In a switching voltage power supply, a series regulator circuit interconnects an input voltage section with an output voltage section of the switching power supply. The regulator circuit has an n-channel MOSFET transistor serving as a regulator element. A gating circuit applies a gating voltage to the gate terminal relative to the drain terminal for establishing states of current conduction and current cut-off in the transistor. A biasing circuit interconnects the gating circuit with the drain terminal for establishing an offset potential of the gate terminal relative to the drain terminal during the state of current conduction, the offset potential counteracting a gate-to-source threshold voltage for reduction of a voltage drop between the drain terminal and the source terminal with a corresponding reduction in power dissipation of the regulator element.

21 Claims, 7 Drawing Sheets

SWITCHING POWER SUPPLY

BACKGROUND OF THE INVENTION

This invention relates to a switching power supply having a series-pass regulator and, more particularly, to a modification of voltages applied to the regulator for increased efficiency of operation.

Switching voltage DC power supplies represent a significant advancement in the ease of implementing an efficient switching power supply. Most electronic applications require a positive voltage step-down regulator. Such a regulator may be constructed as a MOSFET transistor (MOSFET), more specifically, a MOSFET. Such a transistor may be constructed as a p-channel or an n-channel MOSFET. A p-channel MOSFET series-pass regulator provides a more efficient operation of the power supply, but such transistor is limited in selection, both in terms of voltage and in current handling capabilities, than is the case with an n-channel MOSFET. For technical reasons, a wide variety of n-channel MOSFET's is available in high voltage and high current capabilities. Therefore, an n-channel MOSFET would appear to be a preferred candidate for use in a series-pass regulator.

However, the n-channel MOSFET presents a problem due to an undesirably high amount of power dissipated within the MOSFET serving as the series-pass regulator. Typically, in the operation of the MOSFET as the regulator, the MOSFET is operated in either a cut-off state of zero current flow, or in a saturated state of maximum current flow between the source and the drain terminals. In the saturated state, there is the minimum threshold voltage between the gate and the source terminals which can be 5 volts of or more. The product of the saturation current times the threshold voltage represents a significant amount of power to be dissipated within the MOSFET. In contrast, in the case of a p-channel MOSFET, the power dissipated is much lower than in the n-channel MOSFET, and is due to a resistive power loss between the source and the drain terminals wherein the resistance is less than 0.1 ohm. Thus, utilization of the n-channel MOSFET introduces the problem of excessive power dissipation within the regulator element.

SUMMARY OF THE INVENTION

The aforementioned problem is overcome and other advantages are provided by a switching voltage DC power supply having a series regulator element comprising an n-channel MOSFET, wherein a drain terminal of the transistor connects with an input voltage section of the power supply and a source terminal of the transistor connects with an output voltage section of the power supply. The MOSFET operates in conjunction with additional voltage biasing circuitry which, in accordance with the invention, offsets a voltage level between the gate and the drain terminals to reduce the difference in voltage between the drain and the source terminals associated with the gate-to-source threshold voltage. As a result, the product of the current flow between the drain and the source terminals multiplied by the voltage drop between the drain and the source terminals is significantly reduced, thereby reducing the power dissipated within the series regulator element.

Three embodiments of the invention are provided. In each of the embodiments, the voltage between the drain and the gate terminals is switched between two voltage levels, wherein one voltage level terminates conduction of current through the regulator element and the other voltage level induces conduction of current through the regulator element. The voltage applied to the gate terminal includes a bias voltage established between the gate and the drain terminals to provide the desired offset in the voltage level between the gate and the drain terminals. In a first embodiment of the invention, the bias voltage is obtained from an additional winding on a transformer utilized in obtaining input DC voltage from an input AC power line. In a second embodiment of the invention, the bias voltage is obtained by modification of an output inductive filter element to include an additional winding element for providing the bias voltage. In the third embodiment of the invention, pulsations of voltage across the output inductive filter element are employed to generate the bias voltage.

BRIEF DESCRIPTION OF THE DRAWING

The aforementioned aspects and other features of the invention are explained in the following description, taken in connection with the accompanying drawing figures wherein.

Identically labeled elements appearing in different ones of the figures refer to the same element but may not be referenced in the description for all figures.

DETAILED DESCRIPTION OF THE INVENTION

To facilitate a description of the present invention, it is useful to review construction of a series regulator circuit in a switching voltage power supply in accordance with the prior art. Two such power supplies are shown in the circuits of FIGS. 1 and 2 wherein each of the circuits has the same components including a MOSFET serving as a series regulator element, except that the MOSFET in FIG. 1 is constructed with a p-channel while the MOSFET in FIG. 2 is constructed with an n-channel.

Figure 1:
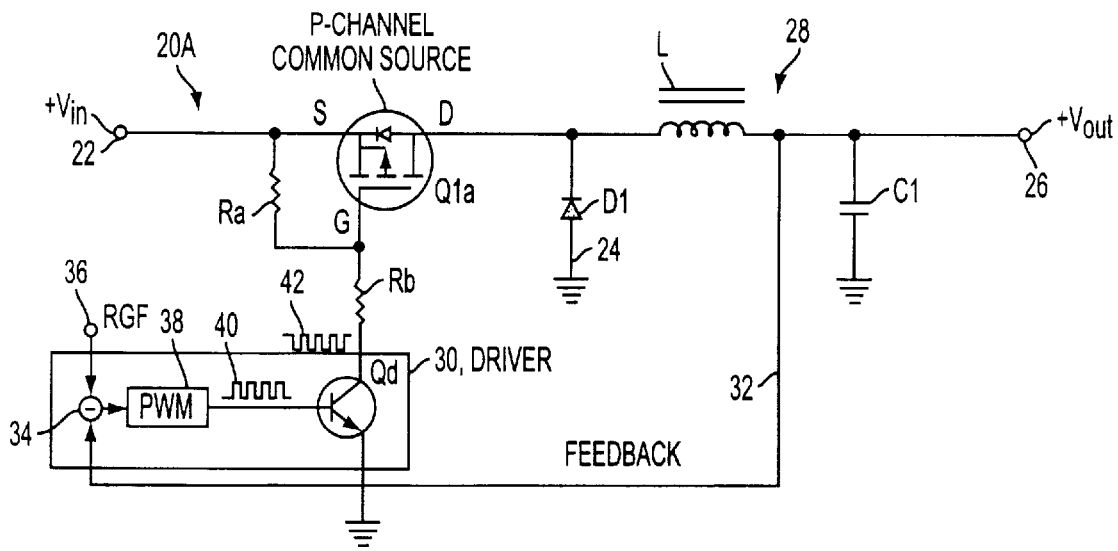
FIG. 1 is a schematic diagram of electrical circuitry for a switching voltage DC power supply having a series regulator element comprising a p-channel MOSFET in accordance with the prior art.
Figure 2:
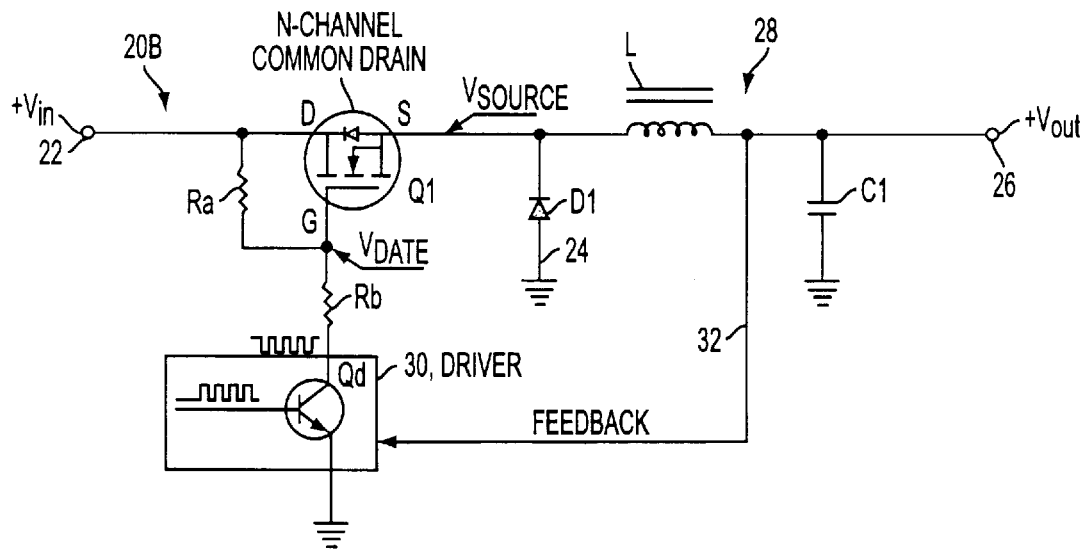
FIG. 2 is a schematic diagram of a switching voltage DC power supply of the prior art wherein the series regulator element is an n-channel MOSFET.

With reference to FIGS. 1 and 2, there are shown circuits, respectively, of power supplies 20A and 20B. The power supply 20A comprises a series-pass regulator transistor Q1a having the form of a p-channel MOSFET with a source S, a drain D and a gate G. The source terminal of the transistor Q1a connects to an input terminal 22 of the power supply 20A, which receives a DC (direct current) input voltage, $V_{in}$, between the input terminal 22 and ground 24. Terminal 22 is positive relative to ground. The drain terminal of the transistor Q1a connects via an inductor L to an output terminal 26 of the power supply 20A. Terminal 26 provides an output voltage, $V_{out}$, which is positive relative to ground. A diode D1 connects between ground and the drain terminal of the transistor Q1a, the anode of the diode D1 being at ground and the cathode of the diode D1 connecting to the drain terminal. A capacitor C1 connects between the terminal 26 and ground. The diode D1 in conjunction with the inductor L and the capacitor C1 constitute an output filter 28 of the power supply 20A. Also included within the power supply 20A is the circuitry of a driver 30 which applies a pulse-width modulated signal via a resistor Rb to the gate terminal of the transistor Q1a for placing the transistor Q1a in alternate states of saturated current conduction and non-conduction of current between the source and the drain terminals. A resistor Ra interconnects the source and the gate terminals of the transistor Q1a.

The foregoing description of the connection of the components of the supply 20A to the transistor Q1a in FIG. 1 applies also in FIG. 2 to the connection of the corresponding components of the supply 20B with a series-pass regulator transistor Q1 having the form of an n-channel MOSFET, except that the locations of the source and the drain terminals are interchanged within the circuit.

In the operation of the circuits of FIGS. 1 and 2, a feedback signal is supplied via line 32 from the output terminal 26 to the driver 30. In the driver 30, the output voltage provided by line 32 is sensed by a sensor 34 which compares the output voltage to the manually adjustable voltage of a reference 36. Also included within the driver 30 is a pulse generator with pulse width modulation by a modulator 38 controlled by an output signal of the sensor 34. The modulator 38 drives the base of a driver transistor Qd which supplies pulses of current to the serial connection of the resistors Ra and Rb between input terminal 22 and ground to develop the gating voltage at the gate G of the transistor Q1a (FIG. 1) and Q1 (FIG. 2). The average value of the pulse-width modulated signal outputted by the driver 30 is adjusted by the driver 30 to maintain a desired level of voltage at the output terminal 26. The pulsations of current in the series-regulator transistors Q1a and Q1 are smoothed by the energy storage within the inductor L and the capacitor C1 of the output filter 28. The diode D1 provides a path for flow of current through the inductor L between pulses of current in the series-regulator transistor Q1a and Q1. Current waveforms at the base and collector terminals of the driver transistor Qd a shown respectively at 40 and 42.

In FIG. 1, when the driver transistor Qd does not conduct current, there is no voltage drop across the resistor Ra between the source and the gate, other than an infinitesimal drop associated with gate current which can be neglected. The potentials of the gate and the source are equal. Therefore, no current flows within the transistor Q1a. When the driver transistor Qd conducts, the potential at the gate of the transistor Q1a is reduced relative to its source to initiate current flow within the transistor Q1a. The reverse situation is found in FIG. 2 such that, when the driver transistor Qd does not conduct current, there is no voltage drop across the resistor Ra between the drain and the gate, other than an infinitesimal drop associated with gate current which can be neglected. The potentials of the gate and the drain are equal, and are positive with respect to the source. Therefore, saturation current flows within the transistor Q1. When the driver transistor Qd conducts, the potential at the gate of the transistor Q1 relative to its source is reduced to a value less than the conductance threshold voltage between gate and source, this resulting in a termination of current flow in the n-channel transistor Q1.

An important consideration in the operations of the p-channel transistor Q1a and the n-channel transistor Q1 is the amount of power dissipated in each transistor. It is noted that, during states of current conduction within either one of the transistors, saturation current is employed to minimize unwanted power dissipation within the transistor. In the case of the p-channel transistor Q1a, a minimum value of power dissipated within the transistor is determined by internal resistance of the transistor between the drain and the source. In the case of the n-channel transistor Q1, a minimum value of power dissipated within the transistor is determined by the magnitude of the conductance voltage threshold between the gate and the source in the circuit of FIG. 2, wherein the potential of the gate is less than or equal to the potential of the drain, and the potential of the source is lower than the potential of the drain.

Figure 3:
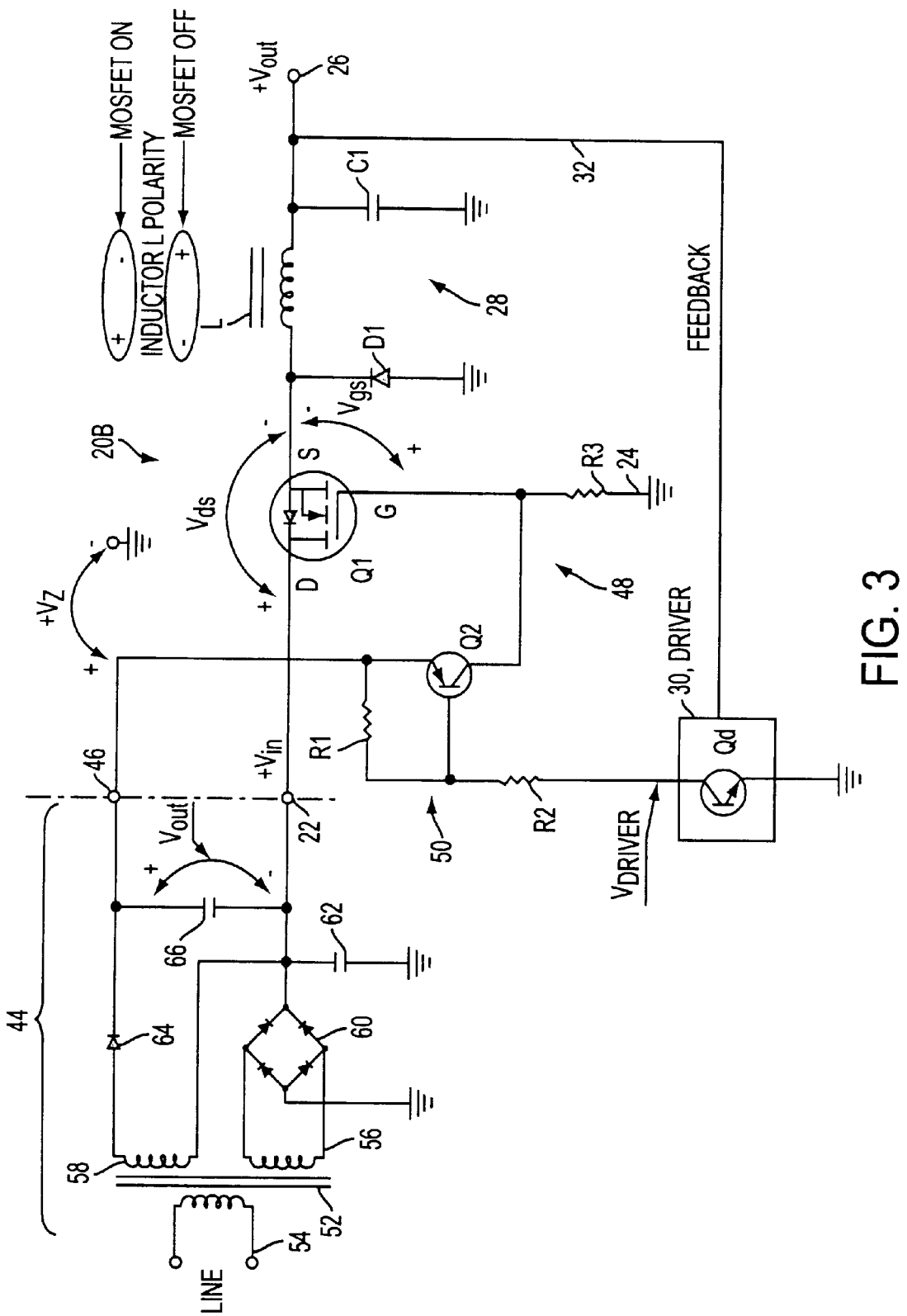
FIG. 3 is a schematic diagram of a switching voltage DC power supply wherein a bias voltage is applied to a gate terminal of the regulator element in accordance with a first embodiment of the invention.

FIG. 3 shows electrical circuitry of a preferred embodiment of the present invention which overcomes the disadvantage of the circuitry in FIG. 2 by removing the dependency of power dissipation on the magnitude of the conductance voltage threshold between the gate and the source. In the practice of all of the embodiments of the invention, it is recognized that the power dissipated within the series-pass regulator transistor, be it the p-channel transistor Q1a or the n-channel transistor Q1, is the product of the transistor current multiplied by the voltage drop between the drain and the source. In the circuit of FIG. 2, the voltage drop between the drain and the source is greater than or equal to the gate-to-source threshold voltage. In the embodiment of the invention disclosed in FIG. 3, as well as in the embodiments of FIGS. 5 and 7, the voltage drop between the drain and the source is substantially less than the threshold voltage, such that the potential of the source may rise to a value approximately equal to the potential of the drain.

With reference in FIG. 3, the power supply 20B comprises components previously described in with reference to FIG. 2, the components including the n-channel, series-pass regulator transistor Q1 connecting between an input voltage section 44 and an output voltage section of the power supply 20B. The output voltage section of the power supply 20B is constituted by the output filter 28 which has been described with reference to FIG. 2. The input voltage section 44 provides the voltage Vin at the input terminal 22, and also provides at terminal 46 an additional bias voltage Vadd which is added to the gating voltage provided by the driver 30 to the gate G of the transistor Q1. Also included in the power supply 20B is the previously described driver 30 receiving the feedback signal along line 32, and also three resistors R1, R2 and R3, and a gating transistor Q2. The gating transistor Q2 is a p-n-p bipolar transistor which, in combination with the resistor R3, constitute gating circuitry 48 for applying a gating voltage to the gate of the transistor Q1. The resistors R1 and R2 constitute biasing circuitry 50, and interconnect the driver 30 and terminals of the transistor Q2 with the terminal 46 for adding the additional bias voltage Vadd to the voltage of the gating circuitry 48. The magnitude of the voltage at terminal 46, relative to ground, is represented as V2. The bias voltage Vadd is measured between terminals 46 and 22.

The input section 44 comprises a transformer 52 having an input winding 54, a first output winding 56 and a second output winding 58. A diode bridge rectifier 60 is connected across terminals of the first output winding 56 for converting an AC (alternating current) voltage coupled via the transformer 52 to a DC voltage, namely the voltage Vin at terminal 22, which appears across a capacitor 62. Current outputted by the second output winding 58 is rectified by a diode 64 to appear as a DC voltage, namely the bias voltage Vadd at the terminal 46, which voltage appears across a capacitor 66. The input winding 54 connects with an input power line, and the transformer 52 reduces the input power-line voltage to produce the voltage Vin by use of the first output winding 56 and the voltage V2 by use of the second output winding 58.

The resistors R1 and R2 are connected serially between the terminal 46 and the collector terminal of the transistor Qd of the driver 30. The resistor R1 connects between the emitter and the base terminals of the gating transistor Q2. The resistor R2 connects between the base terminal of the transistor Q2 and the collector of the driver transistor Qd. The resistor R3 connects between the gate terminal of the regulator transistor Q1 and ground 24. The collector terminal of the gating transistor Q2 connects with the junction of the resistor R3 and the gate terminal of the regulator transistor Q1.

In operation, the driver transistor Qd is placed alternately in states of conduction and non-conduction, as has been described with reference to FIG. 2, to draw down current from terminal 46 via the resistors R1 and R2. The drawing of current through the resistors R1 and R2 establishes a voltage across the base-emitter junction of the transistor Q2 to place the transistor Q2 in a state of conduction, driving current through the resistor R3. In the absence of current in the resistor R3, the gate voltage at the transistor Q1 is at ground. The current in the resistor R3 raises the voltage of the gate of the transistor Q1 relative to the source of the transistor Q1 by an amount equal to or greater than the gate-to-source threshold voltage, thereby to induce a state of current conduction within the transistor Q1. Also shown in FIG. 3 are the voltages and their polarities between the drain and the source, and the gate and the source of the transistor Q1. Also shown is the voltage polarity across the inductor for the case wherein the transistor Q1 is conducting and for the case in which the transistor Q1 is nonconducting.

In accordance with a feature of the invention, the emitter terminal of the gating transistor Q2 connects with the terminal 46 to receive the voltage V2, rather than connecting with the terminal 22 for receiving the voltage Vin, and thereby enables the transistor Q2 to raise the voltage of the gate G of the transistor Q1 to a level higher than the voltage of the drain of the transistor Q1. Since, in the operation of the transistor Q1, the voltage level at the source S follows the voltage level at the gate G by an amount equal to the threshold voltage, the transistor Q1 conducts current in the usual fashion, as described previously with reference to FIG. 2, but the level of voltage at the source S rises to a much higher level relative to the drain D than is possible with the circuitry of FIG. 2. Indeed, in accordance with the invention, by raising the gate voltage an amount equal to the additional bias Vadd, the level of voltage at the source S of the transistor Q1 may rise to a level approximately equal to that of the voltage at the drain D. The voltage of the source does not rise to a value above that of the drain. As a result, the power dissipation in the regulator transistor Q1, which power dissipation is equal to the product of the current times the voltage drop between drain and source, is greatly diminished.

Figure 4:
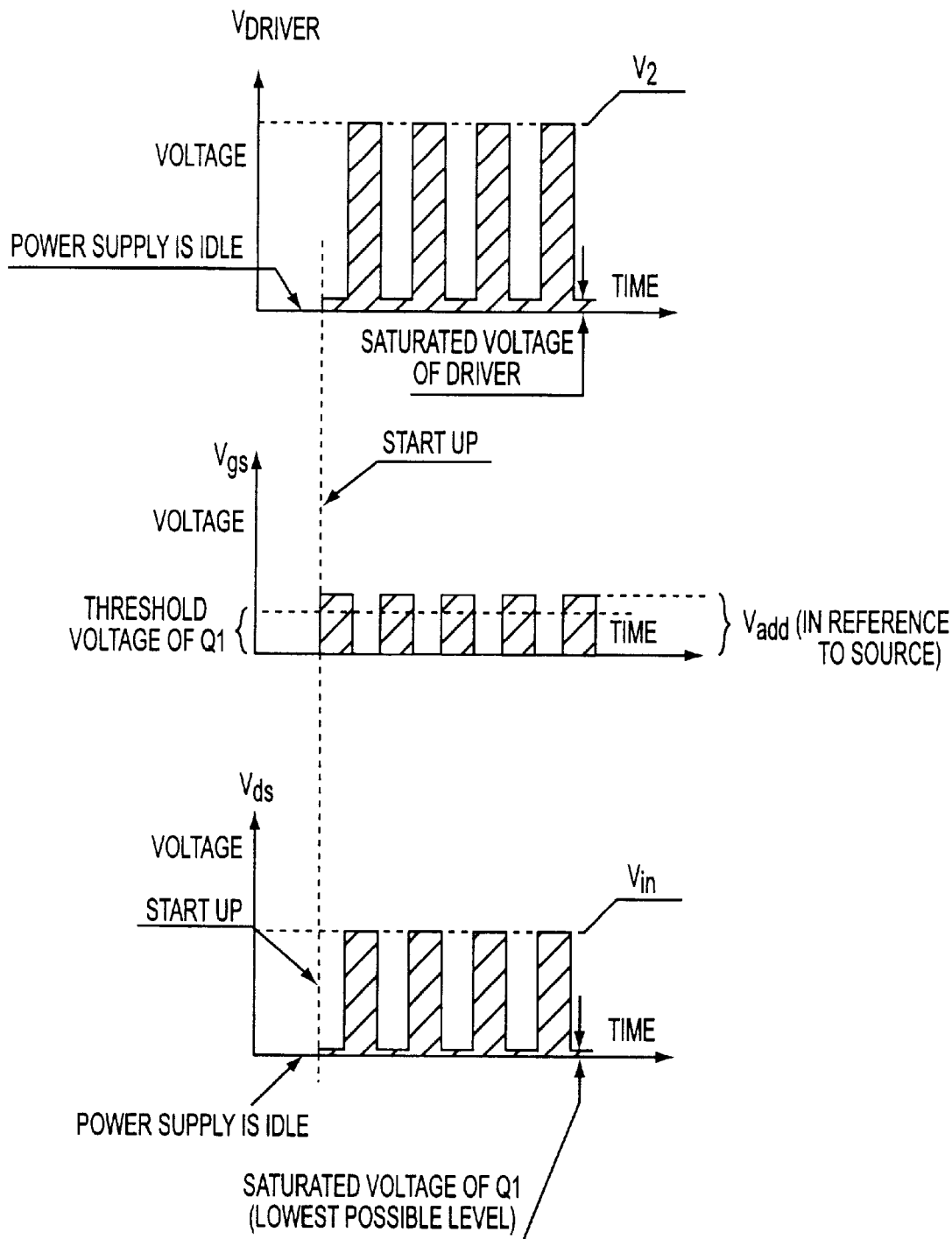
FIG. 4 is a set of graphs describing voltages appearing in the circuitry of FIG. 3.

FIG. 4 shows waveforms describing voltages as a function of time present in the circuitry of FIG. 3. The upper graph of FIG. 4 shows the voltage outputted by the driver 30 to the transistor Q2. The waveform begins at the time that the power supply is idle and shows the initial portion and further portions of a waveform. The second and third graphs of FIG. 4 are in time registration with the first graph. The second graph shows waveforms of the voltage between the gate and the source of the transistor Q1. Both the gate-to-source threshold and the additional bias Vadd are indicated in the graph. The third graphs shows the voltage drop across the transistor Q1 between the drain and the source terminals. Both of the first and the third graphs show the saturation voltage level of the transistor Q1.

Figure 5:
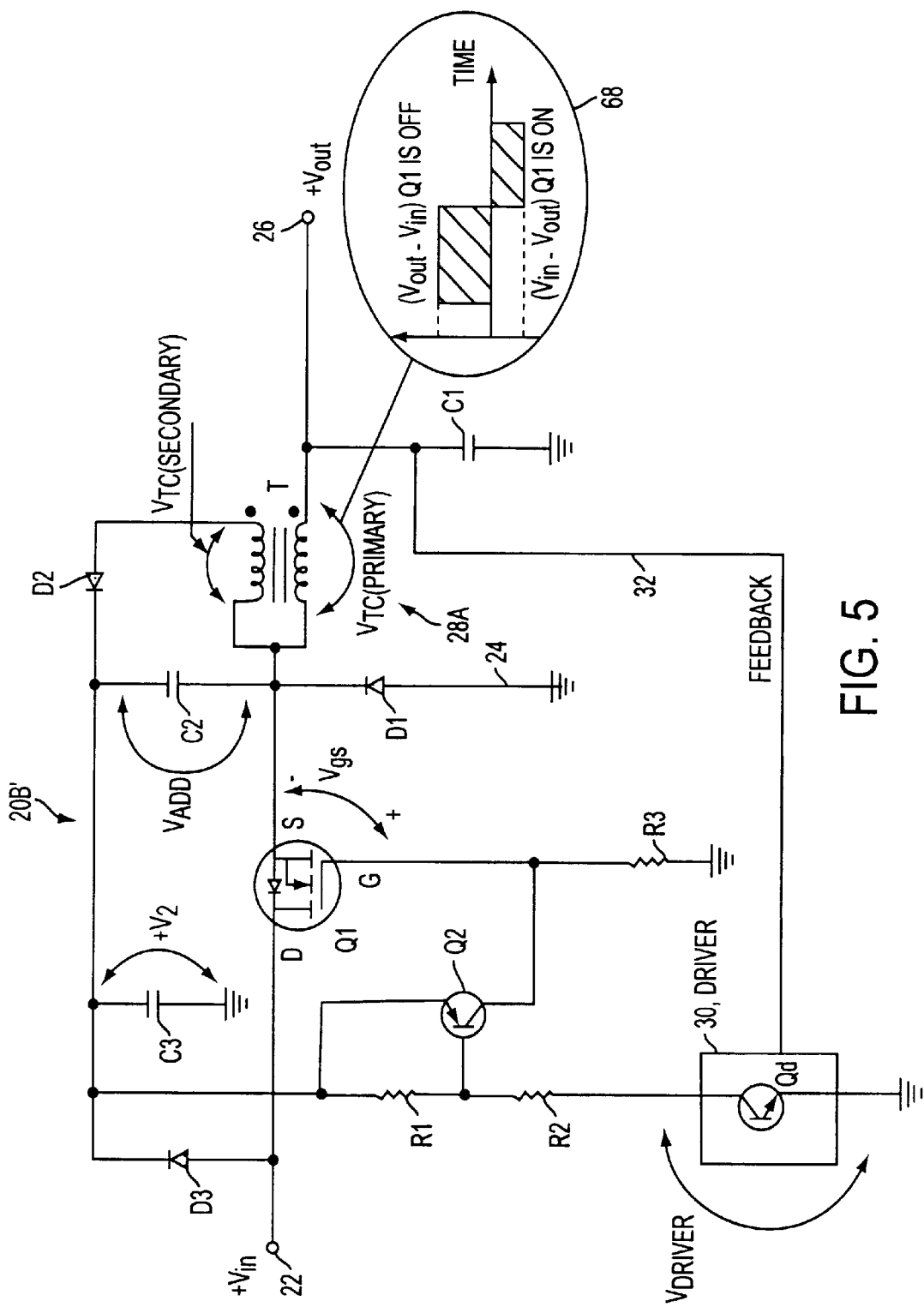
FIG. 5 is a schematic diagram of a switching voltage DC power supply wherein a bias voltage is applied to a gate terminal of the regulator element in accordance with a second embodiment of the invention.

FIG. 5 shows a second embodiment of the power supply 20B' in accordance with the invention which is similar in many respects to the embodiment of FIG. 3. With respect to the input voltage section 44 of FIG. 3, this has been reduced to simply the terminal 22 in FIG. 5, it being presumed that some sort of source of input DC voltage, possibly a battery, is employed. The feedback line 32, the driver 30, the transistors Q1 and Q2, and the resistors R1, R2 and R3 are shown in FIG. 5 as in FIG. 3. The output filter 28A of FIG. 5 differs from the output filter 28 of FIG. 3 in that, in FIG. 5, the primary winding of a tapped inductor T serves the function of the inductor L of FIG. 3. The tapped inductor T includes a secondary winding outputting a voltage which is rectified by a diode D2 to provide the additional bias Vadd across a capacitor C2. The additional bias Vadd of FIG. 5 serves the same function as has been disclosed above with reference to FIG. 3; however, instead of being provided by a winding of the input transformer 52 as in FIG. 3, is provided by a winding from the output tapped inductor T in FIG. 5.

In the discussion of the circuitry of FIG. 3, it was noted that the pulsations of current flowing through the inductor L result in alternation in polarity of voltage drop across the inductor, and similarly, in the operation of the circuitry of FIG. 5, alternations occur in the polarity of voltage pulses appearing across the primary winding of the tapped inductor T as depicted in a graph 68. The pulsations in polarity in FIG. 5 can induce a voltage also on the secondary winding of the tapped inductor T to attain the bias voltage Vadd. It is noted that the pulsations in current through the winding of the tapped inductor T are not obtained until after operation of the power supply 20B' is initiated. Accordingly, it is advantageous to employ a further diode D3 which connects between the input terminal 22 and a further capacitor C3 for charging the capacitor C3 with any pulsations of voltage which may be present at terminal 22, thereby to attain a temporary, and possibly smaller, source of the bias voltage Vadd. The capacitor C3 connects to ground while the capacitor C2 connects to the junction of the source of the transistor Q1 and a terminal of the tapped inductor T.

Figure 6:
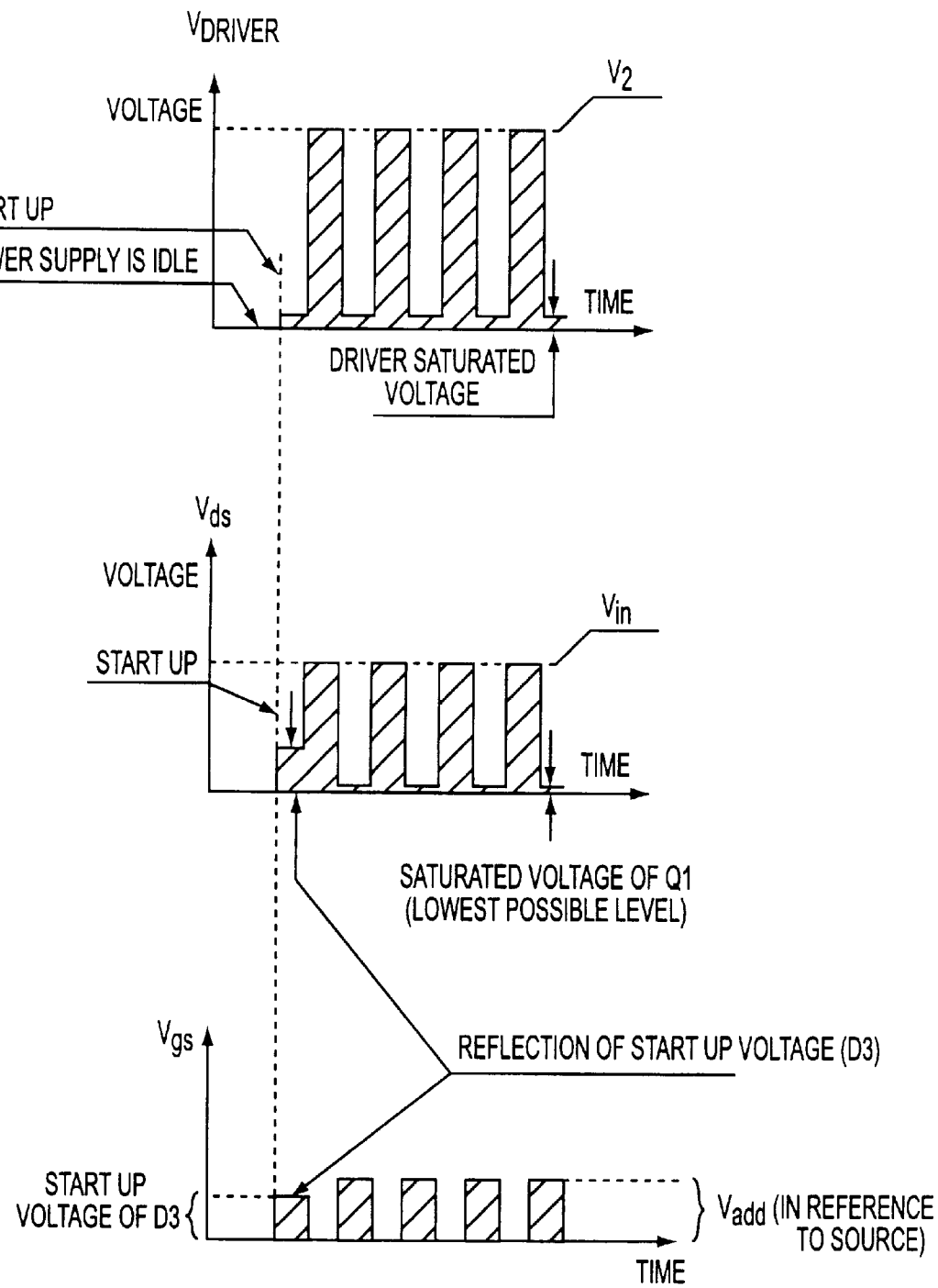
FIG. 6 is a set of graphs describing voltages appearing in the circuitry of FIG. 5.

FIG. 6 shows a set of graphs for describing voltages appearing in the circuit of FIG. 5. The set of voltages depicted in FIG. 6 is the same set of voltages which is depicted in FIG. 4. The three graphs are in time registration with an indication being given in each of the graphs of the startup portions of each of the waveforms.

Figure 7:
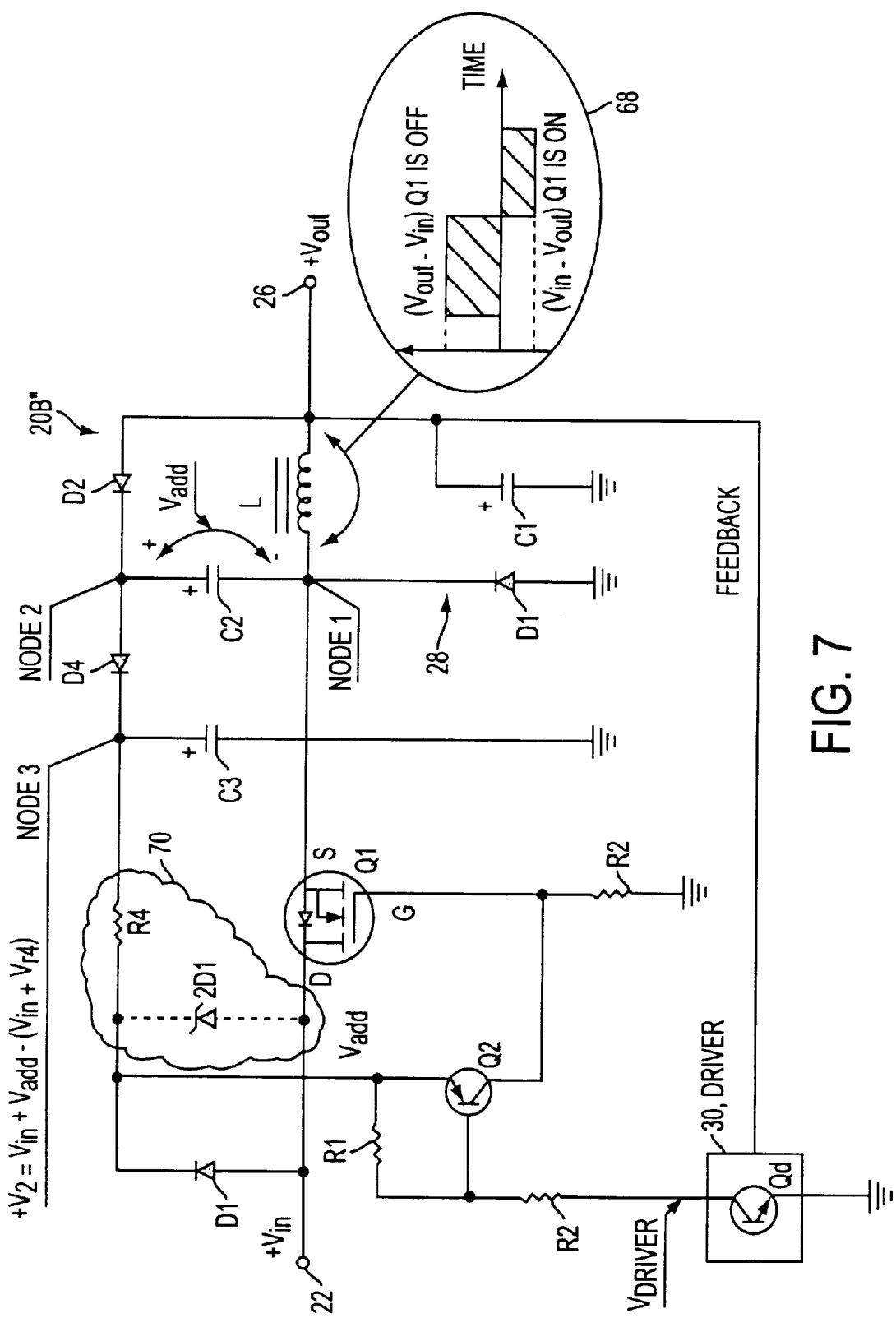
FIG. 7 is a schematic diagram of a switching voltage DC power supply wherein a bias voltage is applied to a gate terminal of the regulator element in accordance with a third embodiment of the invention.

FIG. 7 shows circuitry of a further embodiment of power supply 20B" for providing DC-to-DC voltage conversion in accordance with the invention, the circuitry being substantially the same as that of FIG. 5, except for the substitution of the inductor L in place in the tapped inductor T. In FIG. 7, the voltage pulsations across the inductor L are employed directly with the diode D2 and the capacitor C2 to generate a bias voltage. The voltage appearing across the capacitor C2 is applied through a further rectification stage, in the manner of a voltage doubler, by use of diode D4 connecting with capacitor C3. Diode D3 connects with input terminal 22 to apply a startup voltage to capacitor C3 for providing the additional bias voltage during the initial stage of operations of the power supply 20B". As a further feature in this embodiment of the invention, it is recognized that the voltage of the additional bias appearing across the capacitor C3 may be excessively large, in the sense of exceeding the manufacturer specifications for the transistor Q1. Accordingly, this embodiment provides for a voltage protection circuit 70 comprising a resistor R4 and a zener diode ZD1, wherein the voltage level of the zener diode is within the manufacturer specifications for the transistor Q1. The additional bias voltage Vadd is attained from the capacitor C3 via the resistor R4 at a junction between the resistor R4 and the zener diode. The components, resistor R4 and diode ZD1, of the protection circuit 70 are shown in dashed line to indicate that the protection circuit 70 can be omitted for values of Vadd falling within the acceptable voltage ranges for transistor Q1, in which case diode ZD1 is omitted, and resistor R4 is a short circuit. To facilitate further discussion of the operation of the circuitry of FIG. 7, three of the circuit nodes are identified as node 1, node 2 and node 3.

Figure 8:
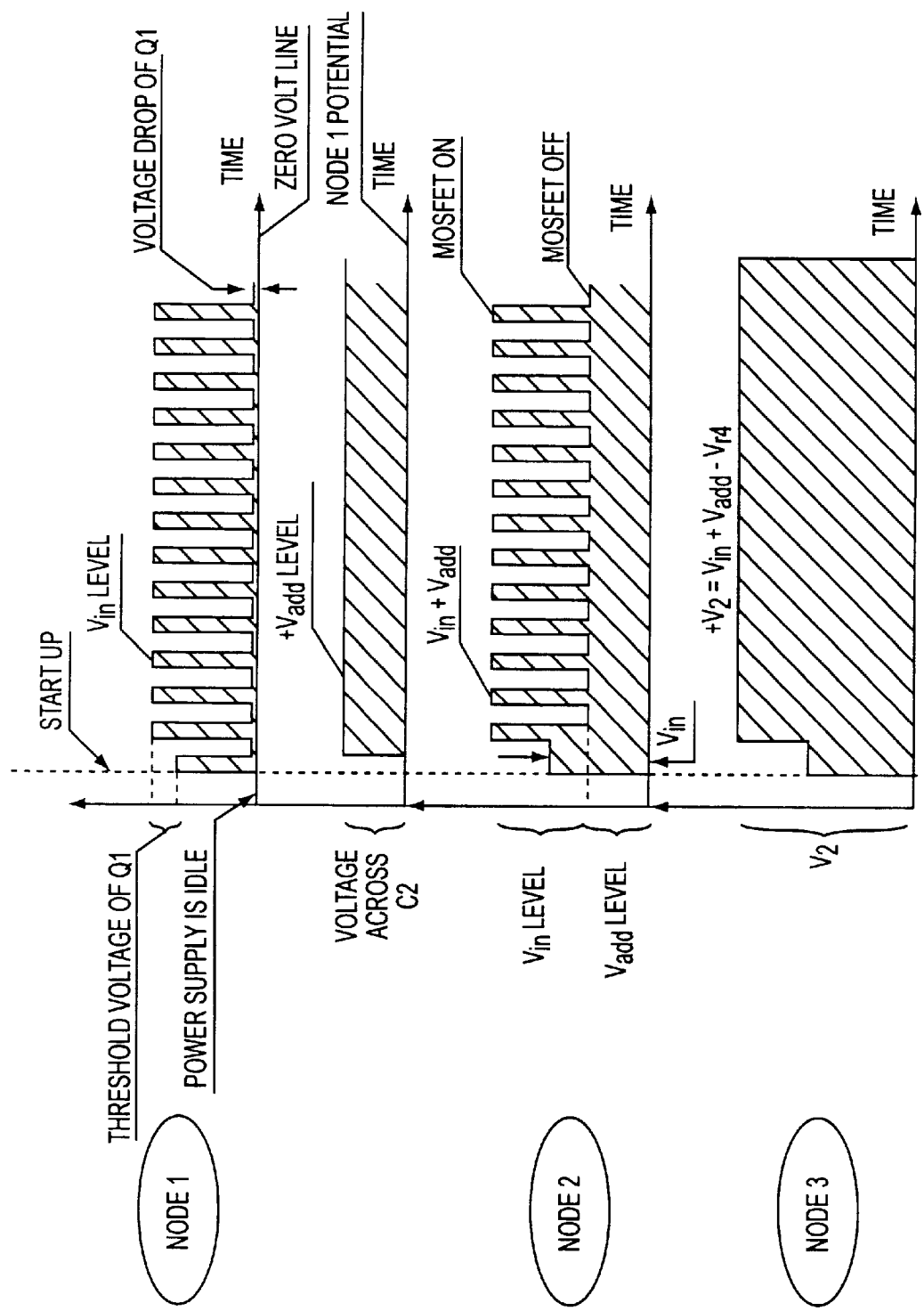
FIG. 8 is a set of graphs describing voltages appearing in the circuitry of FIG. 7.

FIG. 8 shows a set of four graphs in time registration with each other, the graphs representing waveforms appearing in the circuit of FIG. 7. The first graph shows the voltage appearing at node 1. The second graph shows the voltage appearing across the capacitor C2. The third graph shows the voltage appearing at node 2. The fourth graph shows the voltage appearing at node 3. The startup period of time is also indicated in the graphs. The voltage levels corresponding to Vin, Vadd and V2 are also shown.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A series regulator circuit operative in a switching voltage power supply, comprising:
   an n-channel MOSFET transistor serving as a regulator element of the series regulator circuit and having a drain terminal, a source terminal, and a gate terminal, wherein the drain terminal connects with an input voltage section of the power supply and the source terminal connects with an output voltage section of the power supply;
   a gating circuit applying a gating voltage to the gate terminal relative to the drain terminal for establishing states of current conduction and current cut-off between the drain and the source terminals of the transistor; and
   a biasing circuit interconnecting the gating circuit with the drain terminal for establishing an offset potential of the gate terminal relative to the drain terminal during the state of current conduction, the offset potential counteracting a gate-to-source threshold voltage for reduction of a voltage drop between the drain terminal and the source terminal during the state of current conduction with a corresponding reduction in power dissipation of the regulator element during operation of the switching power supply.

2. A series regulator circuit according to claim 1 wherein, during the state of current conduction, the current is a saturation current.

3. A series regulator circuit according to claim 1, wherein the transistor of the regulator element is a MOSFET.

4. A series regulator circuit according to claim 1, wherein said biasing circuit includes a diode and an energy storage element connected serially to said input voltage section of the switching power supply for establishing said offset potential.

5. A series regulator circuit according to claim 1, wherein said output voltage section of the switching power supply comprises and output filter having an inductive element and a capacitive element, said inductive element including a winding section for tapping off a voltage from the inductive element, and wherein said biasing circuit includes a diode and an energy storage element connected serially across said winding section for establishing said offset potential.

6. A series regulator circuit according to claim 5, wherein the diode of said biasing circuit is a first diode and the energy storage element of said biasing circuit is a first energy storage element, and wherein said biasing circuit further comprises a second diode and a second energy storage element connected serially to said input voltage section of the switching power supply for initiating operation of said biasing circuit.

7. A series regulator circuit according to claim 1, wherein said output voltage section of the switching power supply comprises an output filter having an inductive element and a capacitive element, and wherein said biasing circuit includes a diode and an energy storage element connected serially across said inductive element for establishing said offset potential.

8. A series regulator circuit according to claim 7, wherein the diode of said biasing circuit is a first diode and the energy storage element of said biasing circuit is a first energy storage element, and wherein said biasing circuit further comprises a second diode and a second energy storage element connected serially to said input voltage section of the switching power supply for initiating operation of said biasing circuit.

9. A series regulator circuit according to claim 8, wherein said biasing circuit further comprises a voltage-protection circuit interconnecting said first diode and said second diode for limiting a value of said offset potential.

10. A switching voltage power supply including an input voltage section, an output voltage section, and a series regulator circuit interconnecting the input voltage section with the output voltage section, wherein the series regulator circuit comprises:
    an n-channel MOSFET transistor serving as a regulator element of the series regulator circuit and having a drain terminal, a source terminal, and a gate terminal, wherein the drain terminal connects with the input voltage section of the switching power supply and the source terminal connects with the output voltage section of the switching power supply;
    a gating circuit applying a gating voltage to the gate terminal relative to the drain terminal for establishing states of current conduction and current cut-off between the drain and the source terminals of the transistor; and
    a biasing circuit interconnecting the gating circuit with the drain terminal for establishing an offset potential of the gate terminal relative to the drain terminal during the state of current conduction, the offset potential counteracting a gate-to-source threshold voltage for reduction of a voltage drop between the drain terminal and the source terminal during the state of current conduction with a corresponding reduction in power dissipation of the regulator element during operation of the switching power supply.

11. A switching power supply according to claim 10, wherein said input voltage section and said output voltage section share a common ground terminal, and wherein said gating circuit includes a resistor connecting said gate terminal with said ground terminal and a gating transistor connecting said biasing circuit to a junction of said resistor with said gate terminal.

12. A switching power supply according to claim 10 wherein, during the state of current conduction, the current is a saturation current.

13. A switching power supply according to claim 10, wherein the transistor of the regulator element is a MOSFET.

14. A switching power supply according to claim 10, wherein said biasing circuit includes a diode and an energy storage element connected serially to said input voltage section of the switching power supply for establishing said offset potential.

15. A switching power supply according to claim 10, wherein said output voltage section of the switching power supply comprises and output filter having an inductive element and a capacitive element, said inductive element including a winding section for tapping off a voltage from the inductive element, and wherein said biasing circuit includes a diode and an energy storage element connected serially across said winding section for establishing said offset potential.

16. A switching power supply according to claim 15, wherein the diode of said biasing circuit is a first diode and the energy storage element of said biasing circuit is a first energy storage element, and wherein said biasing circuit further comprises a second diode and a second energy storage element connected serially to said input voltage section of the switching power supply for initiating operation of said biasing circuit.

17. A switching power supply according to claim 10, wherein said output voltage section of the power supply comprises and output filter having an inductive element and a capacitive element, and wherein said biasing circuit includes a diode and an energy storage element connected serially across said inductive element for establishing said offset potential.

18. A switching power supply according to claim 17, wherein the diode of said biasing circuit is a first diode and the energy storage element of said biasing circuit is a first energy storage element, and wherein said biasing circuit further comprises a second diode and a second energy storage element connected serially to said input voltage section of the switching power supply for initiating operation of said biasing circuit.

19. A switching power supply according to claim 18, wherein said biasing circuit further comprises a voltage-protection circuit interconnecting said first diode and said second diode for limiting a value of said offset potential.

20. A switching power supply according to claim 19, wherein said input voltage section and said output voltage section share a common ground terminal, and wherein said gating circuit includes a resistor connecting said gate terminal with said ground terminal and a gating transistor connecting said biasing circuit to a junction of said resistor with said gate terminal.

21. A switching power supply according to claim 20, further comprising a driver responsive to an output voltage of said output voltage section for driving said gating transistor with a pulse-width modulated signal, and a series-resistor circuit interconnecting said driver with a base terminal of said gating transistor and a junction of said gating transistor with said biasing circuit.

* * * * *